United States Patent [19]

Stewart

[11] Patent Number: 5,111,085
[45] Date of Patent: May 5, 1992

[54] DIGITALLY CONTROLLED DELAY CIRCUIT

[75] Inventor: John W. Stewart, Wichita, Kans.

[73] Assignee: NCR Corporation, Dayton, Ohio

[21] Appl. No.: 43,778

[22] Filed: Apr. 29, 1987

[51] Int. Cl.[5] .................. H03K 5/13; G11C 11/34
[52] U.S. Cl. ..................................... 307/603; 307/606;
 307/263; 307/451
[58] Field of Search ............... 307/606, 594, 601, 605,
 307/576, 579, 585, 452, 451, 465, 469, 468, 603,
 304, 448, 246, 268, 263, 264, 597; 328/55

[56] References Cited

U.S. PATENT DOCUMENTS

| Re. 32,515 | 10/1987 | Shoji | 307/448 |
| 4,209,713 | 6/1980 | Satou et al. | 307/451 |
| 4,424,456 | 1/1984 | Shiraki et al. | 307/268 |
| 4,620,116 | 10/1986 | Ozawa | 307/463 |
| 4,638,190 | 6/1987 | Hwang et al. | 328/155 |
| 4,658,161 | 4/1987 | Spencer | 307/480 |
| 4,709,170 | 11/1987 | Li | 328/55 |

FOREIGN PATENT DOCUMENTS 0031583 7/1981 European Pat. Off. .
0171022 2/1986 European Pat. Off. .

OTHER PUBLICATIONS

Ruoff, "Field Effect Transistor Clocked Logic", IBM Tech. Disclosure, vol. 8, No. 4, Sep. 1965, pp. 640–641.
Patent Abstracts of Japan, vol. 10, No. 213, Jul. 25, 1986.
IBM Technical Disclosure Bulletin, vol. 27, No. 12, May 12, 1985, "CMOS Delay Circuit", pp. 7134–7135.

Primary Examiner—Timothy P. Callahan
Attorney, Agent, or Firm—Wilbert Hawk, Jr.; Edward Dugas; Stephen F. Jewett

[57] ABSTRACT

A first inverter circuit is coupled between a first voltage source and a reference potential by a plurality of cascaded transistors. Each of the cascaded transistors has a control gate which may be selected to bring the resistance of the transistor into circuit with the inverter circuit to control the charging rate of a distributed capacitance. An output circuit coupled to the first inverter circuit provides the distributed capacitance and an inverted buffered output. The output circuit also includes an output which may be connected to another circuit of the present invention to form a cascaded delay circuit and to receive a reset signal for resetting the cascaded delay circuit.

9 Claims, 2 Drawing Sheets

DIGITALLY CONTROLLED DELAY CIRCUIT

BACKGROUND OF THE INVENTION

The present invention relates to a circuit for selectively delaying an input trigger signal and more particularly to a delay circuit wherein precise increments of delay are selected in response to a control signal.

A delay circuit is a circuit having an output which is delayed by a prescribed time interval from an applied input. In a variable delay circuit, the time delay between the input signal and the output signal is adjustable, within limits, by the variation of one or more circuit parameters. In general, the variation in time delay is accomplished by the variation in the magnitude of a resistance, a capacitance, or a voltage.

SUMMARY OF THE INVENTION

In accordance with the present invention a first inverter circuit is connected between a source of power and a reference potential by a cascade of parallel connected transistors each having a unique resistance when turned on. Each transistor is individually selectable by applying a control signal to its gate. An output circuit, comprised in part, of a second inverter circuit receives and inverts the output from the first inverter circuit to provide the delayed output. The amount of delay is a function of the resistance of the transistor that is turned "on".

From the foregoing it can be seen that a primary object of the present invention is to provide an improved delay circuit.

It is another object of the present invention to provide a delay circuit wherein the amount of delay is a function of the resistance of the transistor that is turned on.

It is yet another object of the present invention to provide a variable delay circuit which is easily cascaded to provide longer delays.

These and other objects of the present invention will become more apparent when taken in conjunction with the following description and drawing in which like characters indicate like parts and which drawing forms are a part of the present disclosure.

DETAILED DESCRIPTION OF THE INVENTION

Figure 1A:
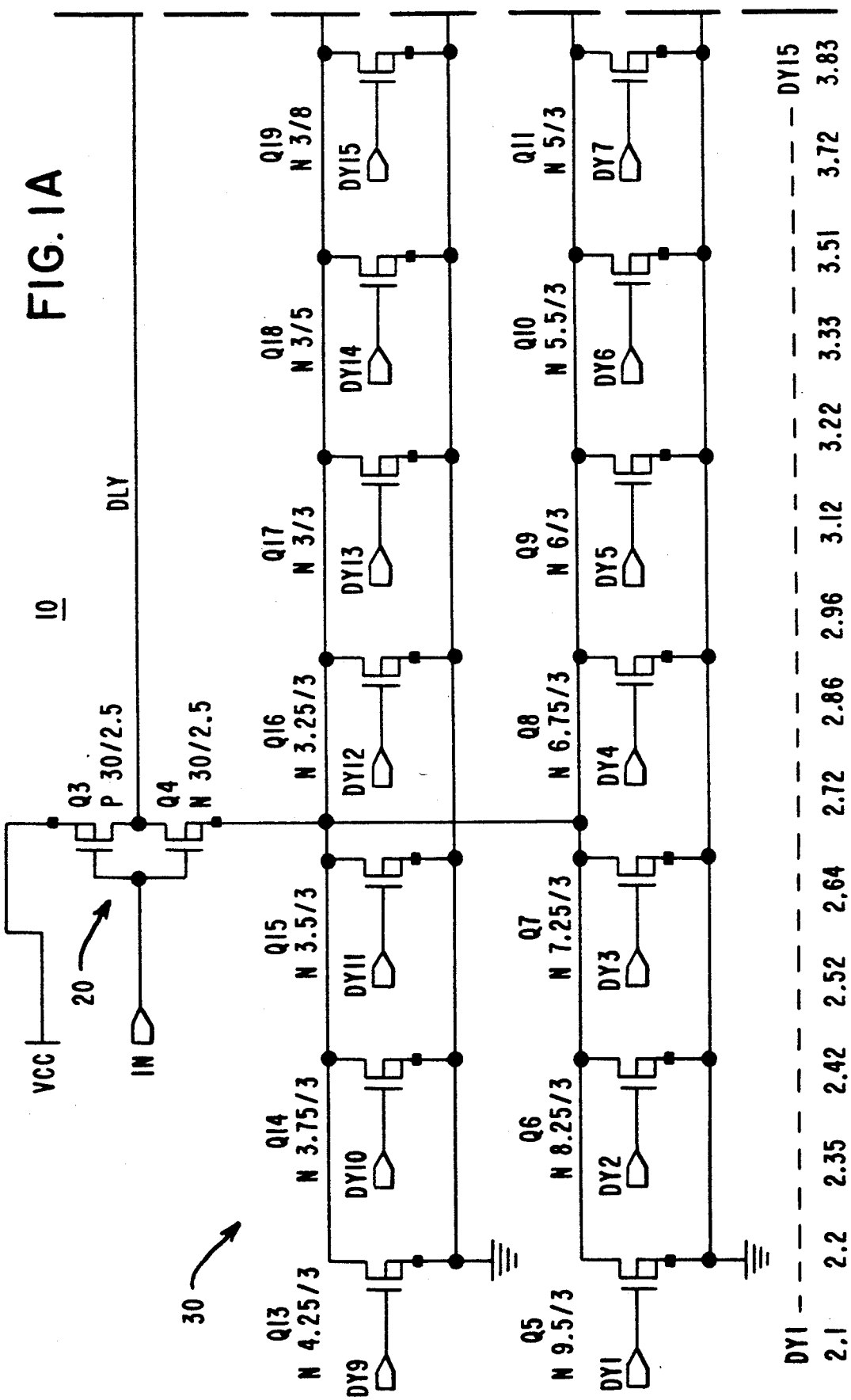
FIGS. 1A and 1B are a schematic diagram of the preferred embodiment of the invention.
Figure 1B:
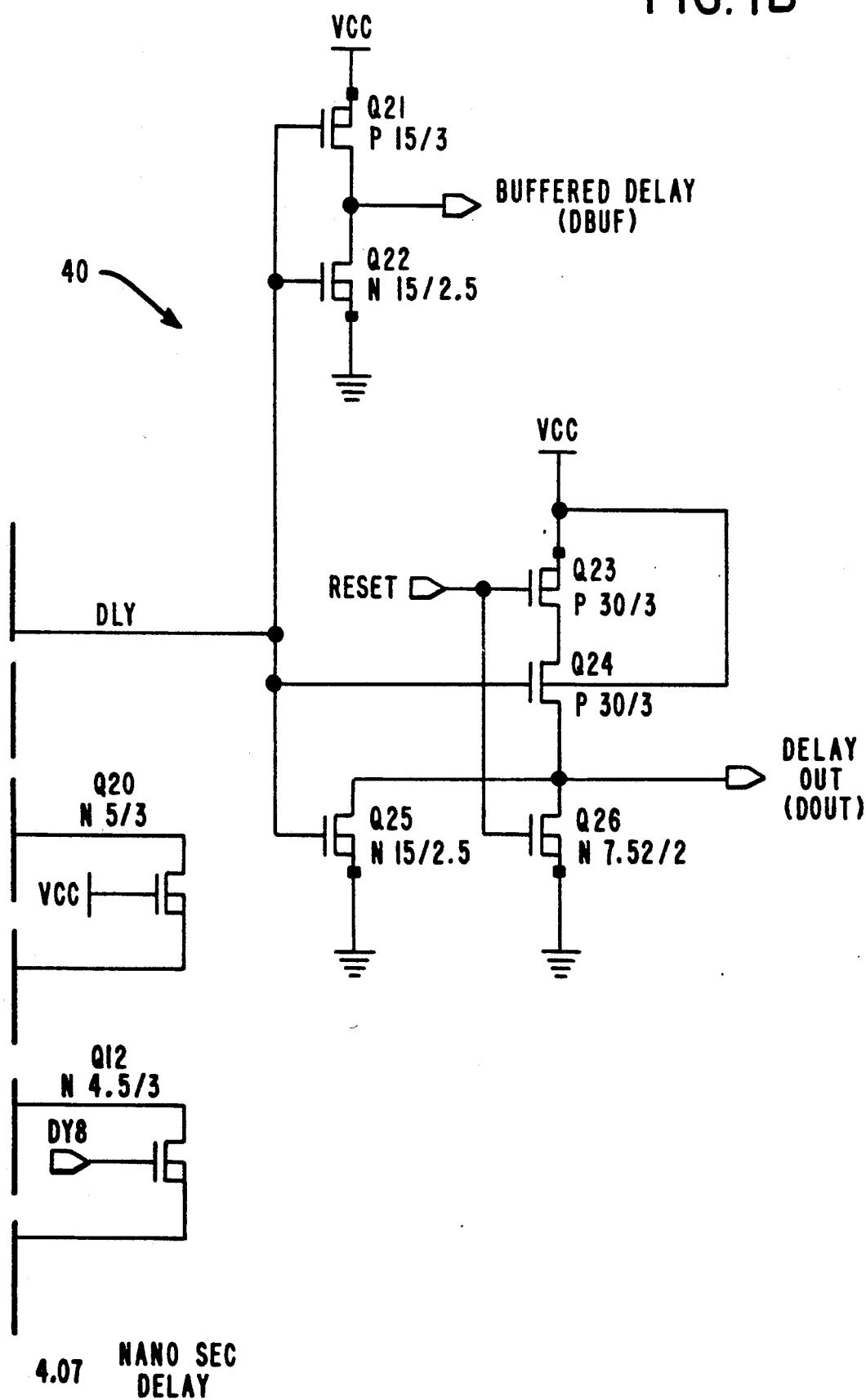

Referring to FIGS. 1A and 1B, the delay circuit 10 is comprised of a first inverter circuit 20 having an input labeled IN and an output labeled DLY, a source of power $V_{CC}$, a reference potential (ground), a cascade 30 of parallel connected transistors and an output circuit 40. The output circuit 40 is connected to the output DLY of the first inverter 20 and provides two outputs, one a buffered delay, DBUF, and the other a delay out, DOUT. One or more of the delay circuits 10 may be cascaded by connecting the DOUT terminal of the first delay circuit 10 to the IN labeled input of the first inverter 20 of a second delay circuit 10.

The first inverter circuit 20 is a CMOS device having a P transistor, $Q_3$, and an N transistor, $Q_4$. Next to transistor $Q_3$ is the labeling P30/2.5 which denotes that transistor $Q_3$ is a P-type device having a gate width, W, equal to 30 microns and a gate length, L, equal to 2.5 microns. As is well known in the art of MOS design, the magnitude of the drain-source current is a function of the ratio W/L. The type of transistor, N or P, and the associated gate ratio for each of the remaining transistors is shown in the drawings adjacent the transistor.

The control gates of transistors $Q_3$ and $Q_4$ are connected to the input terminal IN for receiving the signal that is to be delayed.

The drain of transistor $Q_3$ is connected to the voltage source $V_{CC}$ and the drain of transistor $Q_4$ is placed in circuit to ground through the conductive resistance of transistor $Q_{20}$ when the gate of transistor $Q_{20}$ is connected to the voltage source $V_{CC}$. With the gate ratios shown, and only $Q_{20}$ active, the delay for the input signal is 4.07 nano seconds. Each of the transistors $Q_5$ through $Q_{19}$ have gate electrodes labeled DY1 through DY15, respectively. Each input is switchable between a ground potential or the potential $V_{CC}$ by a control signal. The longest delay is provided when all DY inputs are connected to ground. The shortest intended delay is when DY1 is at the potential $V_{CC}$ and DY2 through DY15 are grounded.

The output circuit 40 comprises a second inverter circuit having transistors $Q_{21}$ and $Q_{22}$, which inverts the signal on line DLY and buffers the inverted signal to its output DBUF. The signal on line DLY is also directed to transistors $Q_{23}$, $Q_{24}$, $Q_{25}$ and $Q_{26}$, which transistors $Q_{23}$, $Q_{24}$, $Q_{25}$ and $Q_{26}$ perform an inverting function along with a reset function that is utilized when two or more delay lines are cascaded for increased delay.

In operation, the conducting resistance of $Q_{20}$ draws a certain amount of current from the line DLY when transistor $Q_4$ is conducting so as to limit the current available to charge/discharge the combined gate capacitance of transistors $Q_{21}$, $Q_{22}$, $Q_{24}$ and $Q_{25}$. When another transistor gate DY is activated, the conducting resistance of that transistor is placed in parallel with the conducting resistance of $Q_{20}$ thereby lowering the resistance between the drain of $Q_4$ and ground. The lower resistance increases the current flow through $Q_4$ thereby increasing the amount of current available for charging/discharging the combined gate capacitance of $Q_{21}$, $Q_{22}$, $Q_{24}$, and $Q_{25}$. As is well known, the shorter the time it takes to charge/discharge the gate capacitance of a MOS transistor (such as transistors $Q_{21}$, $Q_{22}$, $Q_{24}$ and $Q_{25}$), the shorter the delay in the transistor turning "on" or "off". Conversely, the longer it takes to charge the gate capacitors the longer it will take a properly biased transistor to turn "on" or "off".

The rising edge of an input signal is delayed based on which DY input is activated. The falling edge has a minimal delay.

The DBUF output, taken from the source of $Q_{21}$ and the drain of $Q_{22}$, provides the delayed timing output of the delay circuit 10.

As previously stated, transistors $Q_{23}$, $Q_{24}$, $Q_{25}$ and $Q_{26}$ form an inverter circuit and a means for coupling the output of a first delay circuit 10 to the input of a second delay circuit 10 in order to increase the amount of delay beyond that available with one delay circuit.

The function of transistors $Q_{23}$ and $Q_{26}$ is to provide a clear signal for clearing the cascaded delay circuit upon receipt of a RESET signal on their gate electrodes. In the absence of the RESET signal transistors $Q_{24}$ and $Q_{25}$ operate as an inverter and a buffer to invert the signal on the line DLY and to buffer the signal to the next cascaded delay circuit.

While there has been shown what is considered to be the preferred embodiment of the invention, it will be manifest that many changes and modifications may be made therein without departing from the essential spirit of the invention. It is intended, therefore, in the annexed claims, to cover all such changes and modifications that may fall within the true scope of the invention.

I claim:

1. A delay circuit comprising:
   a first resistance;
   an inverter circuit coupled between a first voltage source and a reference potential by said first resistance for receiving a signal to be delayed;
   a plurality of different size resistances connectable in parallel to said first resistance;
   a distributed capacitance circuit coupled to the output of said inverter circuit so that current flows between said inverter circuit and said distributed capacitance circuit and charges the capacitance of said distributed capacitance circuit, said distributed capacitance circuit inverting the signal on the output of said inverter circuit and providing a signal delay as a function of the charging of the capacitance of said distributed capacitance circuit; and
   means for selecting one of said plurality of different size resistances to be actively connected in parallel with said first resistance, so that the amount of the current available to charge the capacitance of said distributed capacitance current may be increased.

2. The delay circuit according to claim 1 wherein each of said plurality of different size resistances is a MOS transistor, having a gate electrode for receiving a signal for selecting said transistor into an on state.

3. The delay circuit according to claim 1 wherein said inverter circuit is comprised of a two transistor CMOS inverter.

4. The delay circuit according to claim 1 wherein said first resistance is a MOS transistor, having a gate electrode connected to said voltage source.

5. The delay circuit according to claim 1 wherein said distributed capacitance circuit is comprised of a second inverter circuit and a third inverter circuit having a means for resetting a cascaded delay circuit.

6. A delay circuit comprising:
   a first inverter circuit for receiving and inverting a signal to be delayed and providing the inverted signal at its output, said first inverter circuit coupled between a voltage source and a reference potential by a first resistance;
   a plurality of different size resistances coupled in parallel to said first resistance means for selectively decreasing the value of said first resistance; and
   a second inverter circuit including distributed capacitance coupled to said first inverter circuit and to said voltage source for inverting and delaying the inverted signal at the output of said first inverter circuit as a function of current flowing through the first resistance.

7. The delay circuit according to claim 6 wherein said first inverter circuit is a two transistor CMOS inverter.

8. The delay circuit according to claim 6 wherein said first resistance is a MOS transistor having a gate electrode connected to said voltage source.

9. The delay circuit according to claim 1, wherein said distributed capacitance circuit is comprised of a two transistor CMOS inverter.

* * * * *